United States Patent
Chang et al.

(10) Patent No.: US 12,322,615 B2
(45) Date of Patent: Jun. 3, 2025

(54) DE-TAPE TOOL

(71) Applicant: Taiwan Semiconductor Manufacturing Company, Ltd., Hsinchu (TW)

(72) Inventors: Chen Liang Chang, Taipei (TW); Kuo Hui Chang, Taoyuan County (TW); Ryder Su, Keelung (TW); Chi-Chun Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 348 days.

(21) Appl. No.: 17/819,307

(22) Filed: Aug. 11, 2022

(65) Prior Publication Data
US 2024/0055280 A1    Feb. 15, 2024

(51) Int. Cl.
*H01L 21/67*    (2006.01)

(52) U.S. Cl.
CPC .............. *H01L 21/67132* (2013.01)

(58) Field of Classification Search
CPC ... H01L 21/30; H01L 23/28; H01L 21/67132; Y10T 156/1057
See application file for complete search history.

(56) References Cited

U.S. PATENT DOCUMENTS

| 2014/0225193 A1* | 8/2014 | Chu | H10D 30/6741 438/151 |
| 2015/0262851 A1* | 9/2015 | Yamashita | B32B 38/0004 156/512 |

\* cited by examiner

*Primary Examiner* — George R Koch
*Assistant Examiner* — Christopher C Caillouet
(74) *Attorney, Agent, or Firm* — KILPATRICK TOWNSEND & STOCKTON LLP

(57) ABSTRACT

A method of removing a sacrificial substructure from a support structure is disclosed. The method includes receiving the support structure, where the support structure has the sacrificial substructure connected thereto, the sacrificial substructure having functioning electrical devices removed therefrom. The method also includes applying a barrier to the sacrificial substructure, puncturing the sacrificial substructure with a puncture plate to secure the sacrificial substructure to the puncture plate, and detaching the sacrificial substructure from the support structure by moving the puncture plate with respect to the support structure.

20 Claims, 7 Drawing Sheets

300 300

DE-TAPE TOOL

TECHNICAL FIELD

The subject matter described herein relates to a tool configured to remove tape from a support structure, and more particularly to a tool configured to remove tape from a support structure used in semiconductor manufacturing.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate.

The formed devices are formed on substrates which include many devices. The devices are tested and identified as good or bad based on test results. The devices are individuated, or the substrate is diced with the substrate adhered to a sacrificial substructure. The good devices are removed from the sacrificial substructure for use. The bad devices and the sacrificial substructure are waste and are sent for waste removal and/or recycling.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
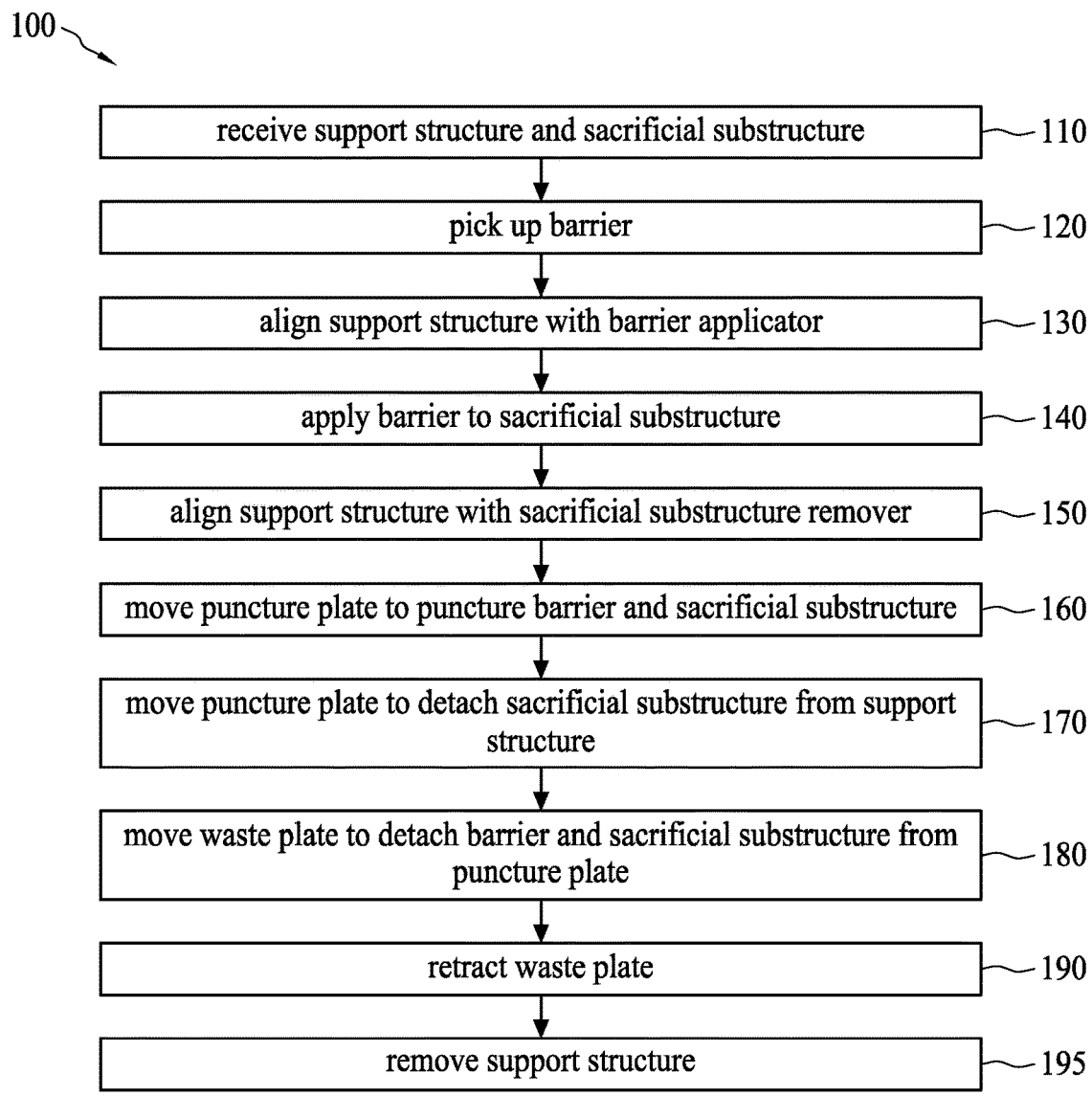
FIG. 1 illustrates a schematic flowchart diagram of a method 100 of removing a sacrificial substructure from a support structure according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. A wafer is typically diced into individual known good dies (KGDs) according to wafer testing of each individual die. The KGDs are bonded through, for example, micro-bumps on a silicon interposer, forming a chip-onwafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology. The individual die which fail the wafer testing are handled, for example, according to embodiments discussed below.

Integrated Fan-Out (InFO) is another wafer-level packaging technology. InFO is a packaging technology that incorporates high-density redistribution layer (RDL) and through InFO via (TIV) for high-density interconnect and performance for various applications, such as mobile devices, high performance computing, etc. A wafer is typically diced into individual known good dies (KGDs) after testing, and the KGDs are placed on a temporary carrier with certain distance apart. RDLs are formed subsequently to enable higher number of external contacts without increasing the size of KGDs. The die which fail the test are handled, for example, according to embodiments discussed below.

On the other hand, those multiple chips that are bonded to the interposer in a CoWoS structure or embedded in an InFO structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding.

Stacking dies featuring ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

As discussed above, semiconductor devices (or die) are tested and identified as good or bad based on the test results. Semiconductor devices which fail the test are identified as bad or failing, and semiconductor devices which pass the test are identified as good or passing. The semiconductor devices are individuated, or the substrate is diced, with the substrate adhered to a sacrificial substructure where, during the semiconductor device individuation process, the sacrificial substructure is not separated into individual pieces and therefor remains a single piece having the individuated semiconductor devices adhered thereto. Accordingly, the semiconductor device individuation process does not result in the devices being loose. The good devices are removed from the sacrificial substructure for use, for example, using a InFO or a CoWoS process, and the bad devices and the sacrificial substructure are waste and are sent for waste removal and/or recycling.

The sacrificial substructure is adhered to a support structure which provides mechanical support to the sacrificial substructure and the individuated semiconductor devices. Once the good semiconductor devices are removed from the sacrificial substructure, the sacrificial substructure and a number of bad semiconductor devices adhered thereto continues to be adhered to the support structure. In order for the support structure to be used for another substrate, the sacrificial substructure and the bad semiconductor devices adhered thereto are removed from the support structure. The sacrificial substructure and the bad semiconductor devices may be sent for waste removal and/or recycling. At least because of the adhesive attached to the sacrificial substructure, removal of the sacrificial substructure from the support structure has conventionally been problematic. For example, it has been conventionally difficult to reliably remove the sacrificial substructure in its entirety, such that no portion of the sacrificial substructure remains adhered to the support structure.

The embodiments discussed herein disclose devices, structures, and methods which allow for reliable removal of the sacrificial substructure.

FIG. 1 illustrates a schematic flowchart diagram of a method 100 of removing a sacrificial substructure from a support structure according to some embodiments. The method 100 may be performed, for example, by a system such as sacrificial substructure removal system 200 illustrated in FIG. 2, below. The method 100 may be performed by other systems. As discussed in further detail below, the system performing method 100 receives a support structure having a sacrificial substructure adhere thereto, and removes the sacrificial substructure therefrom.

Figure 3A:
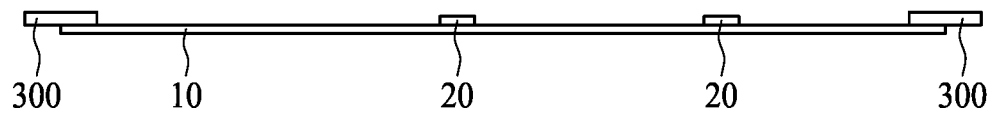
FIGS. 3A-3D illustrate a schematic diagram of a support structure before and after removal of a sacrificial substructure according to some embodiments.
Figure 3B:
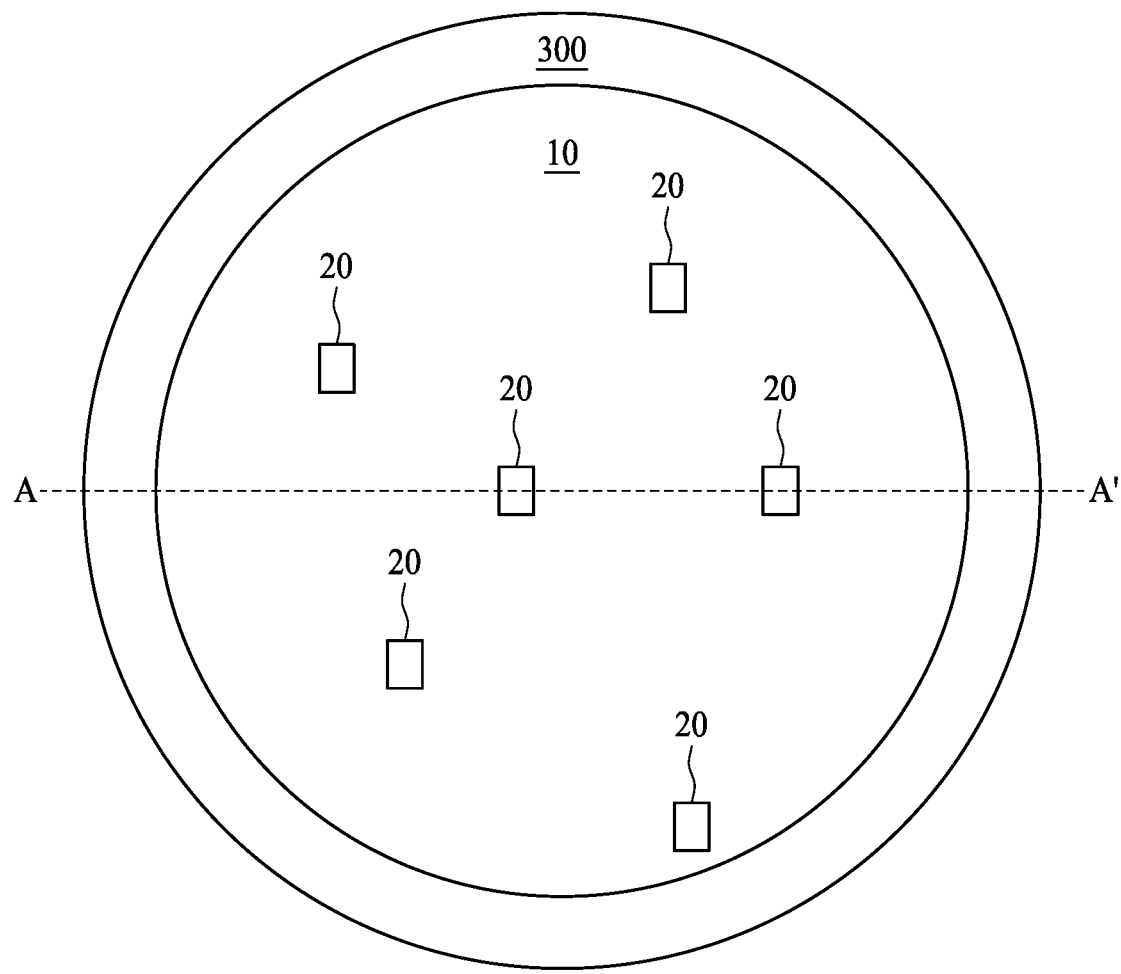

At 110, the system performing the method 100 receives a support structure and a sacrificial substructure connected to the support structure. An example of a support structure having a sacrificial substructure connected or adhered thereto is illustrated in FIGS. 3A and 3B. Other support structures having sacrificial substructures connected thereto may be used.

At 120 a barrier is secured by the system performing method 100. The barrier may comprise one or more of a plastic, a paper, a fabric, and another material. In some embodiments, the barrier is substantially non-adhesive, and does not, accordingly, chemically adhere to the system.

At 130, the system performing method 100 aligns the barrier with the support structure having the sacrificial substructure connected thereto. For example, the barrier may be manipulated by the system so that a central portion of the barrier is aligned with a central portion of the sacrificial substructure and/or the support structure. In some embodiments, the barrier is manipulated by the system so that the sacrificial substructure exposed through an opening of the support structure is entirely covered by the barrier. In some embodiments, other configurations for alignment of the barrier and the support structure and/or the sacrificial substructure are used.

At 140, the barrier is applied to the sacrificial substructure by the system performing method 100. For example, the sacrificial substructure may have an adhesive layer facing the barrier, and at 140, the system causes the barrier to contact the adhesive layer such that the barrier adheres to the sacrificial substructure. In some embodiments, the barrier is caused to adhere to the sacrificial substructure so that the sacrificial substructure exposed through an opening of the support structure is entirely covered by the barrier.

In some embodiments, after the barrier is adhered to the sacrificial substructure, the barrier extends beyond a perimeter of the support structure at all points along the perimeter of the support structure. In some embodiments, after the barrier is adhered to the sacrificial substructure, the barrier extends beyond the perimeter of the support structure at some points along the perimeter of the support structure. In some embodiments, after the barrier is adhered to the sacrificial substructure, the support structure extends beyond a perimeter of the barrier at all points along the perimeter of the barrier.

In some embodiments, after the barrier is adhered to the sacrificial substructure, the barrier extends beyond a perimeter of the sacrificial substructure at all points along the perimeter of the sacrificial substructure. In some embodiments, after the barrier is adhered to the sacrificial substructure, the barrier extends beyond the perimeter of the sacrificial substructure at some points along the perimeter of the sacrificial substructure. In some embodiments, after the barrier is adhered to the sacrificial substructure, the sacrificial substructure extends beyond a perimeter of the barrier at all points along the perimeter of the barrier.

At 150, the system performing the method 100 aligns the support structure having the sacrificial substructure and the barrier adhered to the sacrificial substructure with a sacrificial substructure remover or a particular portion of the sacrificial substructure remover. To align the support structure with the sacrificial substructure remover or the particular portion thereof, the system moves the support structure with respect to the sacrificial substructure remover or particular portion thereof. For example, the support structure may be manipulated by the system so that a central portion of the support structure is aligned with a central portion of the sacrificial substructure remover or particular portion thereof. In some embodiments, the support structure is manipulated by the system so that the sacrificial substructure remover or particular portion thereof is within a volume having a perimeter defined by the opening of the support structure, where the volume extends from the support structure in a direction substantially perpendicular to the support structure. In some embodiments, other configurations for alignment of the support structure and the sacrificial substructure remover or particular portion thereof are used.

At 160, the system performing the method 100 causes the sacrificial substructure remover or particular portion thereof to secure the sacrificial substructure and the barrier connected thereto. For example, the system may move the sacrificial substructure remover or particular portion thereof with respect to the support structure so as to cause the sacrificial substructure remover or particular portion thereof to secure the sacrificial substructure and the barrier connected thereto. As a result of the sacrificial substructure remover or particular portion thereof securing the sacrificial substructure and the barrier connected thereto, additional movement of the sacrificial substructure remover or particular portion thereof causes movement of the sacrificial substructure and the barrier. For example, additional movement of the sacrificial substructure remover or particular portion thereof may cause the sacrificial substructure and the barrier to move with the sacrificial substructure remover or particular portion thereof.

At 170, the system performing the method 100 causes the sacrificial substructure remover or particular portion thereof to remove the sacrificial substructure and the barrier connected thereto from the support structure. For example, the system may move the sacrificial substructure remover or particular portion thereof with respect to the support structure so as to cause the sacrificial substructure remover or particular portion thereof to move through the opening in the support structure. As a result of the sacrificial substructure remover or particular portion thereof moving through the opening in the support structure, the sacrificial substructure remover or particular portion thereof, having the barrier and sacrificial substructure secured thereto, applies a force through the barrier to the sacrificial substructure, where the force causes the sacrificial substructure to completely detach from the support structure.

At 180, the system performing the method 100 causes the sacrificial substructure and the barrier to be removed from the sacrificial substructure remover or particular portion thereof. For example, a first part of the sacrificial substructure remover or particular portion thereof may be caused to move with respect to the sacrificial substructure and with respect to a second part of the sacrificial substructure remover or particular portion thereof, where the movement of the first part causes the sacrificial substructure to detach from the sacrificial substructure remover or particular portion thereof. Once detached, the sacrificial substructure may be processed, for example as waste, and/or maybe recycled.

At 190, the first part of the sacrificial substructure remover or particular portion thereof may be moved or retracted so that the sacrificial substructure remover or particular portion thereof is prepared to process another support structure having a sacrificial substructure and barrier connected thereto.

At 195, the support structure 300 is removed from the sacrificial substructure remover or particular portion thereof so that the sacrificial substructure remover or particular portion thereof is prepared to receive another support structure having a sacrificial substructure and barrier connected thereto.

Figure 2:
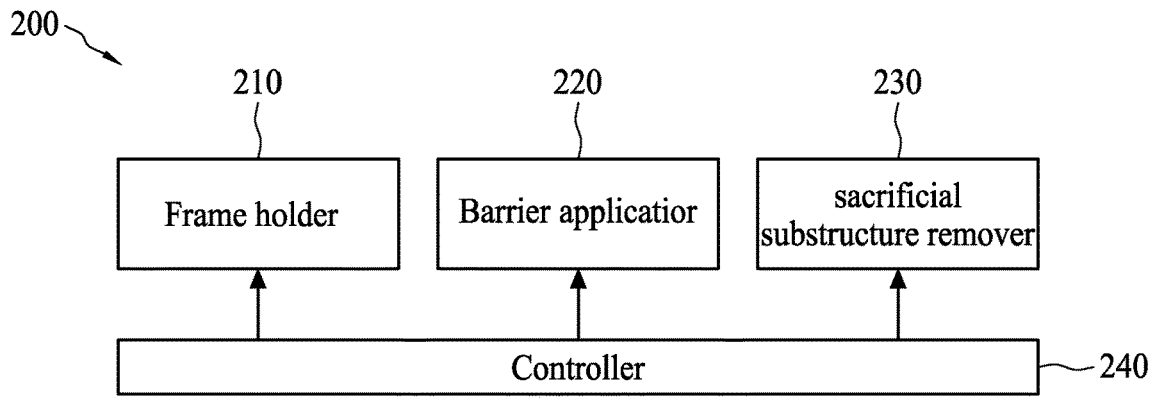
FIG. 2 illustrates a schematic diagram of a sacrificial substructure removal system configured to remove a sacrificial substructure from a support structure according to some embodiments.

FIG. 2 illustrates a schematic diagram of a sacrificial substructure removal system 200 configured to remove a sacrificial substructure from a support structure according to some embodiments. Sacrificial substructure removal system 200 may be configured, for example, to perform method 100 of FIG. 1. Sacrificial substructure removal system 200 may be configured to perform other methods which include the various actions discussed and/or described herein, as understood by those of skill in the art having read the description.

Sacrificial substructure removal system 200 comprises support structure holder 210, barrier applicator 220, sacrificial substructure remover 230, and controller 240.

Support structure holder 210 is configured to manipulate the support structure so that sacrificial substructure removal system 200 may perform, for example the actions of method 100. Support structure holder 210 may comprise, for example a number of clamps, belts, and motors which respond to control signals from controller 242 to appropriately control the position of the support structure.

Barrier applicator 220 is configured to secure a barrier, where the barrier may comprise one or more of a plastic, a paper, a fabric, and another material. In some embodiments, the barrier is substantially non-adhesive, and does not, accordingly, chemically adhere to the barrier applicator 220. The barrier applicator 220 is also configured to align the barrier with the support structure having the sacrificial substructure connected thereto. For example, the barrier may be manipulated by the system so that the sacrificial substructure exposed through an opening of the support structure is entirely covered by the barrier. In some embodiments, other configurations for alignment of the barrier and the support structure and/or the sacrificial substructure are used. The barrier applicator 220 is also configured to contact the barrier to the sacrificial substructure. For example, the barrier application 220 may be configured to cause the barrier to contact an adhesive layer of the sacrificial substructure such that the barrier adheres to the sacrificial substructure. In some embodiments, the barrier application 220 may be configured to cause the barrier to adhere to the sacrificial substructure such that the sacrificial substructure exposed through an opening of the support structure is entirely covered by the barrier.

Sacrificial substructure remover 230 is configured to manipulate the support structure having the sacrificial substructure and the barrier adhered to the sacrificial substructure so that the sacrificial substructure and the barrier may be removed from the support structure. For example, in some embodiments, the sacrificial substructure remover 230 may be configured to manipulate the sacrificial substructure so that the sacrificial substructure remover 230 or a particular portion thereof is within a volume having a perimeter defined by the opening of the support structure, where the volume extends from the support structure in a direction substantially perpendicular to the support structure. In some embodiments, the sacrificial substructure remover 230 may also be configured to secure the sacrificial substructure and the barrier connected thereto, for example, so that additional movement of the sacrificial substructure remover or particular portion thereof causes movement of the sacrificial substructure and the barrier. In some embodiments, the sacrificial substructure remover 230 may also be configured to remove the sacrificial substructure and the barrier connected thereto from the support structure. For example, the sacrificial substructure remover 230 may be configured to move the sacrificial substructure remover or particular portion thereof with respect to the support structure so as to cause the sacrificial substructure remover or particular portion thereof to move through the opening in the support structure, and to, therefore, apply a force to the barrier and to the sacrificial substructure, where the force causes the sacrificial substructure to detach from the support structure. In some embodiments, the sacrificial substructure remover 230 may also be configured to cause the sacrificial substructure and the barrier to be removed from the sacrificial substructure remover 230 or particular portion thereof. For example, the sacrificial substructure remover 230 may cause a first part of the sacrificial substructure remover 230 to move with respect to the sacrificial substructure and with respect to a second part of the sacrificial substructure remover 230, where the movement of the first part guarantees complete removal of the sacrificial substructure from the sacrificial substructure remover 230. In some embodiments, the sacrificial substructure remover 230 may also be configured to retract the first part of the sacrificial substructure remover 230 so that the sacrificial substructure remover 230 is prepared to process another support structure having a sacrificial substructure and barrier connected thereto.

FIGS. 3A-3D illustrate a schematic diagram of a support structure before and after removal of a sacrificial substructure according to some embodiments.

FIGS. 3A and 3B illustrate the support structure 300 with sacrificial substructure 10 adhered thereto. FIG. 3B illustrates a top-down view of support structure 300 with sacrificial substructure 10 adhered to the underside thereof. As shown, sacrificial substructure 10 has multiple devices 20 adhered thereto. In some embodiments, devices 20 comprise semiconductor die formed on a monolithic semiconductor substrate. In some embodiments, devices 20 comprise integrated circuit devices comprising multiple semiconductor die, where each of the semiconductor are formed on one or more monolithic semiconductor substrates. FIG. 3A illustrates a cross-sectional view of support structure 300 taken along the line A-A' indicated in FIG. 3B.

Support structure 300 may comprise, for example, a frame ring, or other similar structure. Support structure 300 may be formed of one or more of a metal, a plastic, and another material. Support structure 300 is rigid enough to provide mechanical support to, for example a semiconductor substrate comprising multiple devices. Accordingly, in some embodiments, support structure 300 is more rigid than sacrificial substructure 10. Support structure 300 surrounds or partly surrounds the substrate. In some embodiments, support structure 300 is more rigid than the substrate. In some embodiments, support structure 300 is less rigid than the substrate.

Sacrificial substructure 10 may comprise, for example, a tape. Sacrificial substructure 10 may be formed, for example, from at least first and second layers. The first layer may comprise, for example, one or more of a plastic, a paper, a fabric, and another flexible or rigid material. The second layer may comprise, for example, one or more of an adhesive and another binding agent configured to cause the first layer to adhere to, for example the substrate and its devices, and the support structure 300.

FIGS. 3A and 3B illustrate support structure 300 having sacrificial substructure 10 adhered thereto, where the devices 20 adhered to sacrificial substructure 10 have been previous identified as failing devices or bad devices. In some embodiments, sacrificial substructure 10 has had a number of devices removed therefrom, where the removed devices have been previously tested and identified as good devices. In the illustrated embodiment, support structure 300 has a circular outer perimeter. In some embodiments, the outer perimeter has a different shape. For example, in some embodiments, the outer perimeter is or is substantially rectangular or oval. In the illustrated embodiment, support structure 300 has a circular inner perimeter forming a boundary of an opening of the support structure 300. In some embodiments, the inner perimeter has a different shape. For example in some embodiments the inner perimeter is or is substantially rectangular or oval.

FIGS. 3A and 3B illustrate support structure 300 prior to the removal of the sacrificial substructure 10, for example by sacrificial substructure removal system 200 illustrated in FIG. 2.

Figure 3C:
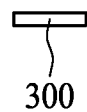
Figure 3C:
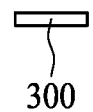
Figure 3D:
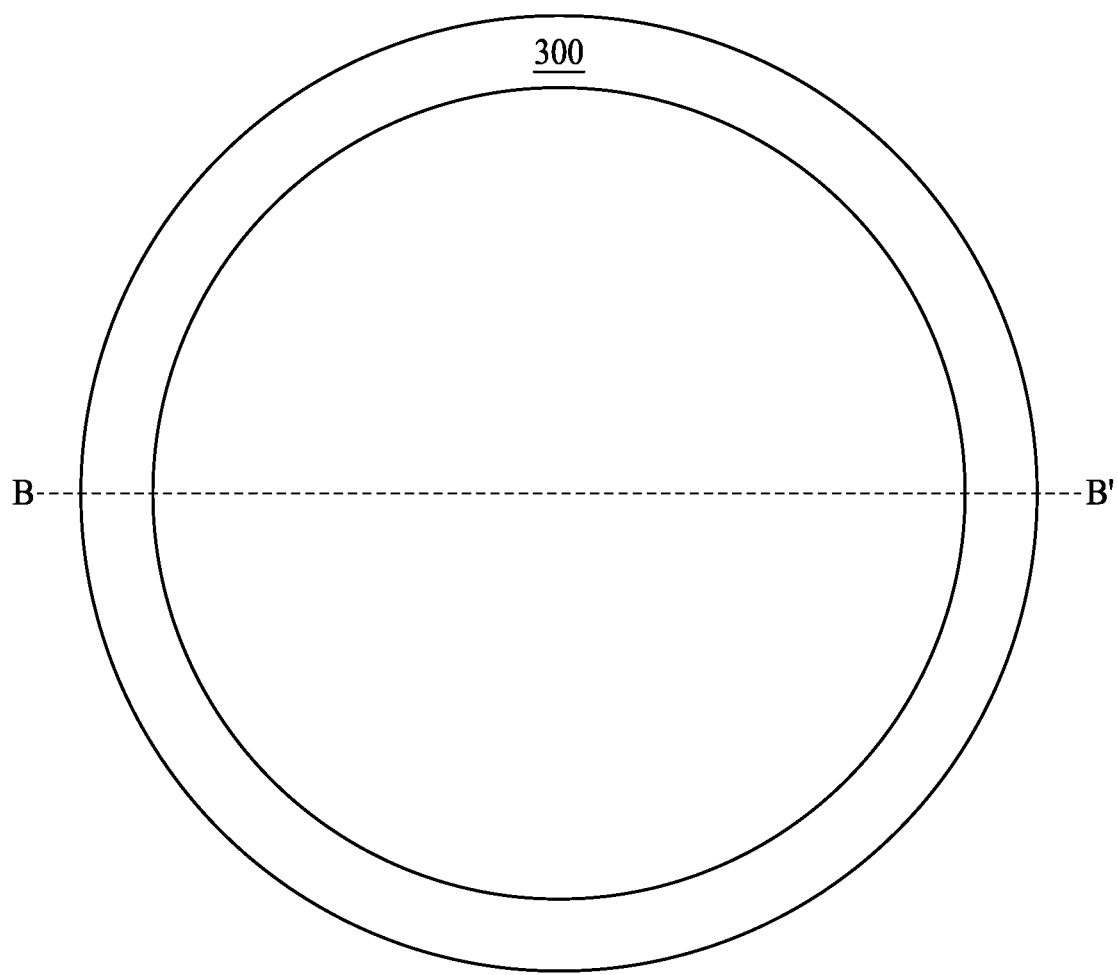

FIGS. 3C and 3D illustrate the support structure 300 after removal of sacrificial substructure 10 and the bad devices 20 attached thereto. In some embodiments, a different number of bad devices 20 are attached to sacrificial substructure 10. For example, in some embodiments, fewer, or more, or no bad devices 20 are attached to sacrificial substructure 10. FIG. 3D illustrates a top-down view of support structure 300 without sacrificial substructure 10. FIG. 3C illustrates a cross-sectional view of support structure 300 taken along the line B-B' indicated in FIG. 3D.

Figure 4:
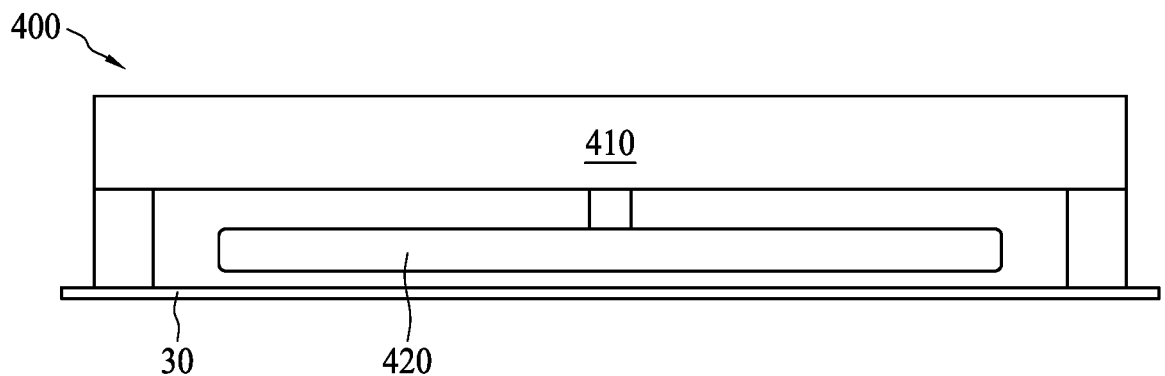
FIGS. 4-6 illustrate a barrier applicator system at various stages of the method of FIG. 1.

FIG. 4 illustrates a barrier applicator system 400 at 120 of the method 100 of FIG. 1. Barrier applicator system 400 may have features similar or identical to barrier applicator 220 discussed above. In some embodiments, barrier applicator 220 may have features similar or identical to barrier applicator system 400. At 120 of method 100, barrier applicator system 400 secures barrier 30. The barrier 30 may, for example, comprise one or more of a plastic, a paper, a fabric, and another material. In some embodiments, the barrier 30 is substantially non-adhesive, and does not, accordingly, chemically adhere to the barrier applicator system 400.

In the illustrated embodiment, barrier applicator system 400 includes barrier securing structure 410 and barrier applicator structure 420.

Barrier securing structure 410 is configured to secure a barrier. For example, in some embodiments, barrier applicator system 400 includes a storage location (not shown) configured to store a number of barriers to be used. The barriers may comprise one or more of a plastic, a paper, a fabric, and another material. In such embodiments, barrier securing structure 410 is configured to retrieve a particular barrier 30 from the barrier storage location, for example in response to control signals from a controller, such as controller 240 discussed above. For example, barrier applicator system 400 may be configured to move barrier securing structure 410 with respect to this barrier storage location such that barrier securing structure 410 is aligned with a particular one of the barriers stored in the barrier storage location. Once barrier securing structure 410 is aligned with the particular barrier 30, barrier applicator system 400 may be configured to cause barrier securing structure 410 to secure the particular barrier 30. For example, barrier securing structure 410 may be configured to apply a negative pressure, such as a vacuum pressure, to the particular barrier such that the particular barrier 30 contacts and is held against the barrier securing structure 410 by the environmental pressure. In some embodiments, barrier securing structure may be configured to secure the particular barrier 30 using an electrostatic attraction mechanism. In some embodiments, other securing mechanisms may be used. In some embodiments, the barrier is substantially non-adhesive, and does not, accordingly, chemically adhere to barrier securing structure 410.

In some embodiments, an outer perimeter of barrier securing structure 410 looking down from the perspective illustrated in FIG. 4 has a shape which conforms with the shape of support structure 300 from the same perspective.

Figure 5:
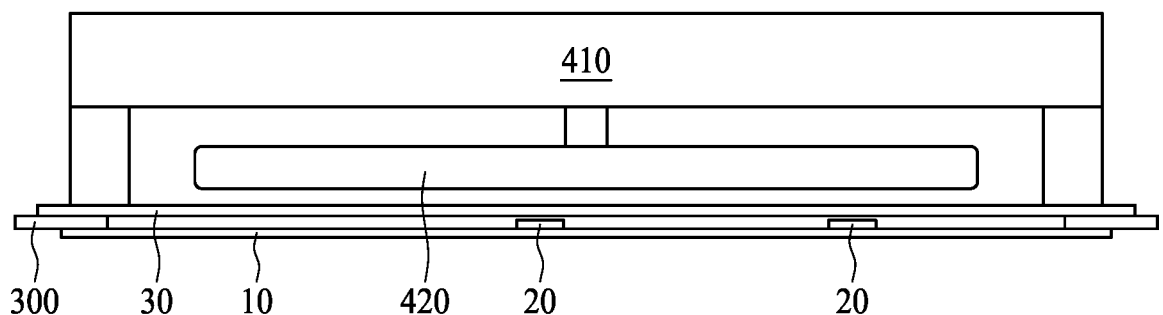

FIG. 5 illustrates a barrier applicator system 400 at 130 of the method 100 of FIG. 1. Accordingly, barrier applicator system 400 may also be configured to align the barrier 30 with the support structure 300 having the sacrificial substructure 10 connected thereto. For example, the barrier 30 may be manipulated by barrier securing structure 410 so that the portion of the sacrificial substructure 10 exposed through the opening of the support structure 300 is entirely covered by the barrier 30. In some embodiments, the controller causes barrier securing structure 410 to move with respect to the barrier applicator system 400 generally to cause the proper alignment. In some embodiments, the controller causes the frame holder to move with respect to the barrier applicator system 400 generally to cause the proper alignment. In some embodiments, the barrier 30 has an outer perimeter defining a shape corresponding with a shape of an outer perimeter of support structure 300.

Figure 6:
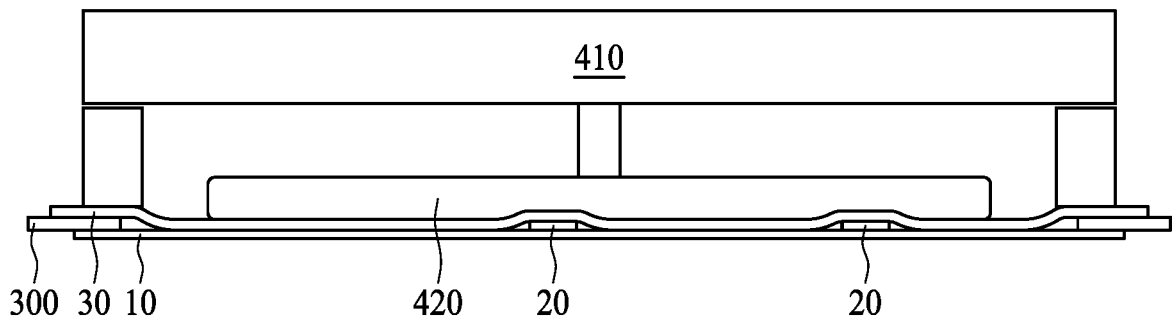

FIG. 6 illustrates a barrier applicator system 400 at 140 of the method 100 of FIG. 1. Accordingly, barrier applicator system 400 may also be configured to apply barrier 30 to the sacrificial substructure 10. For example, in response to a control signal from the controller, barrier applicator structure 420 may be configured to move with respect to support structure 300, sacrificial substructure 10, and barrier 30. In some embodiments, barrier applicator structure 420 is configured to move such that barrier applicator structure 420 exerts a force on barrier 30 causing barrier 32 pressed against sacrificial substructure 10 such that barrier 30 contacts an adhesive layer on sacrificial substructure 10 such that the barrier 30 adheres to the sacrificial substructure 10. In some embodiments, the barrier 30 is caused to adhere to the sacrificial substructure 10 so that the sacrificial substructure 10 exposed through an opening of the support structure 300 is entirely covered by the barrier 30. In some embodiments, barrier applicator structure 420 is configured to apply a pressure on barrier 30, for example by expelling a gas, such as nitrogen or another gas or mixture of gases, where the expelled gas causes barrier 30 to contact and adhere to sacrificial substructure 10. In some embodiments, after the barrier is adhered to the sacrificial substructure, the barrier extends beyond a perimeter of the support structure at all points along the perimeter of the support structure. In some embodiments, after the barrier is adhered to the sacrificial substructure, the barrier extends beyond the perimeter of the support structure at some points along the perimeter of the support structure. In some embodiments, after the barrier is adhered to the sacrificial substructure, the support structure extends beyond a perimeter of the barrier at all points along the perimeter of the barrier. In some embodiments, after the barrier is adhered to the sacrificial substructure, the barrier extends beyond a perimeter of the sacrificial substructure at all points along the perimeter of the sacrificial substructure. In some embodiments, after the barrier is adhered to the sacrificial substructure, the barrier extends beyond the perimeter of the sacrificial substructure at some points along the perimeter of the sacrificial substructure. In some embodiments, after the barrier is adhered to the sacrificial substructure, the sacrificial substructure extends beyond a perimeter of the barrier at all points along the perimeter of the barrier.

Figure 7:
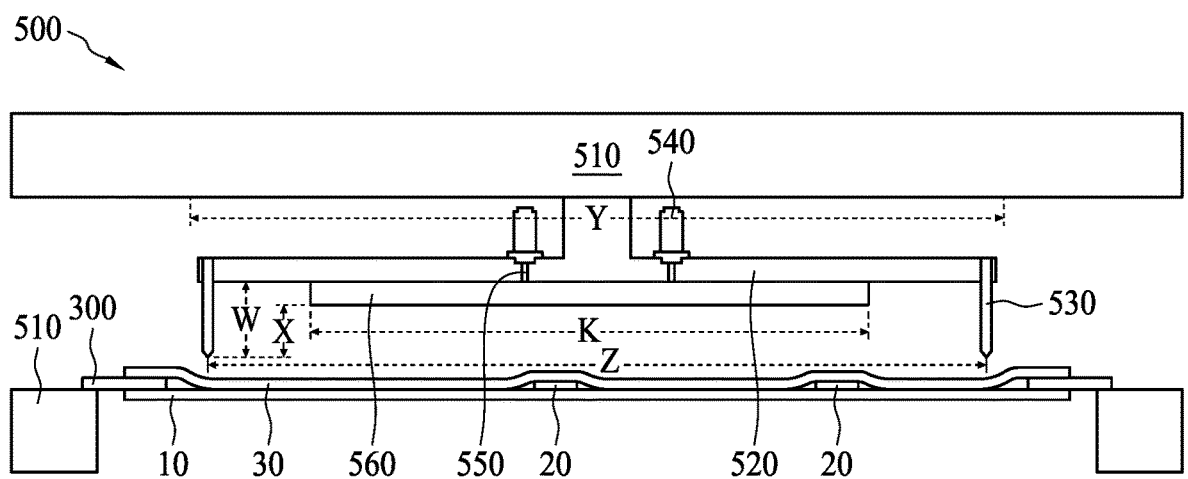
FIG. 7-12 illustrate a sacrificial substructure removal apparatus at various stages of the method of FIG. 1.

FIG. 7 illustrates a sacrificial substructure removal system 500 at 150 of the method 100 of FIG. 1. Sacrificial substructure removal system 500 includes support frame 510, puncture plate 520, puncture pins 530, waste plate 560, waste plate actuators 540, and waste plate actuation pins 550. Sacrificial substructure removal system 500 may have features similar or identical to sacrificial substructure remover 230 discussed above with reference to FIG. 2. In some embodiments, sacrificial substructure remover 230 may have features similar or identical to sacrificial substructure removal system 500.

In some embodiments, an outer perimeter of puncture plate 520 looking down from the perspective illustrated in FIG. 7 has a shape which conforms with or corresponds with the shape of support structure 300 from the same perspective. In the illustrated embodiment, puncture plate 520 has an outer perimeter defining a shape which is able to pass through the opening in support structure 300 without contacting support structure 300. In some embodiments, puncture pins 530 are placed around the perimeter of puncture plate 520. For example, in some embodiments, 2, 3, 4, 5, 6, 7, 8, 9, 10, 11, 12, 15, 20, 25, 30, 35, 40, or another number of puncture pins 530 are placed around the perimeter of puncture plate 520. For example, in some embodiments, the puncture pins 530 are placed at regular angular intervals around the perimeter of puncture plate 520. In some embodiments, other arrangements are used.

In some embodiments, puncture plate 520 is circular and has a diameter Y, where Y is equal to about 8 cm, about 10 cm, about 12 cm, about 15 cm, about 18 cm, about 20 cm, about 25 cm, about 30 cm, about 35 cm, about 40 cm, about 45 cm, about 50 cm, or about another value.

In some embodiments, waste plate 560 is circular and has a diameter K, where K is equal to about 4 cm, about 5 cm, about 6 cm, about 8 cm, about 10 cm, about 12 cm, about 15 cm, about 18 cm, about 20 cm, about 25 cm, about 30 cm, about 35 cm, about 40 cm, about 45 cm, about 50 cm, or about another value. In some embodiments, waste plate 560 has a thickness equal to about 1 mm, about 1.5 mm, about 2 mm, about 2.5 mm, about 3 mm, about 4 mm, about 5 mm, or about another value.

In some embodiments, the ratio of the diameter Y to the diameter K is equal to, greater than, or less than about 0.9, about 1.0, about 1.1, about 1.2, about 1.3, about 1.4, about 1.5, about 1.75, about 2.0, about 2.25, about 2.5, about 2.75, about 3.0, or about another value.

In some embodiments, the space Z between opposite puncture pins 530 is equal to about 9 cm, about 10 cm, about 12 cm, about 15 cm, about 18 cm, about 20 cm, about 25 cm, about 30 cm, about 35 cm, about 40 cm, about 45 cm, about 50 cm, or about another value.

In some embodiments, the ratio of the space Z to the diameter K is equal to, greater than, or less than about 0.5, about 0.6, about 0.7, about 0.75, about 0.8, about 0.9, about 1.0, about 1.1, about 1.2, about 1.3, about 1.4, about 1.5, about 1.75, about 2.0, about 2.25, about 2.5, about 2.75, about 3.0, or about another value.

In some embodiments, the ratio of the space Z to the diameter Y is equal to, greater than, or less than about 0.5, about 0.6, about 0.7, about 0.75, about 0.8, about 0.9, about 1.0, or about another value.

In some embodiments, the distance X the puncture pins 530 extend from the waste plate 560 is equal to about −1 cm, about −0.5 cm, about 0 cm, about 0.5 cm, about 1 cm, about 2 cm, about 4 cm, about 5 cm, about 7.5 cm, about 10 cm, about 15 cm, about 20 cm, about 25 cm, about 30 cm, about 35 cm, about 40 cm, or about another value.

In some embodiments, the distance W the puncture pins 530 extend from the puncture plate 520 is equal to about 0.5 cm, about 1 cm, about 2 cm, about 4 cm, about 5 cm, about 7.5 cm, about 10 cm, about 15 cm, about 20 cm, about 25 cm, about 30 cm, about 35 cm, about 40 cm, or about another value.

In some embodiments, the ratio of the distance W to the difference between the distance W and the distance X (W−X) is equal to, greater than, or less than about 0.9, about 1.0, about 1.1, about 1.2, about 1.3, about 1.4, about 1.5, about 1.75, about 2.0, about 2.25, about 2.5, about 2.75, about 3.0, about 5, about 10, about 15, about 20, about 25, about 30, or about another value.

In some embodiments, diameter Y, diameter K, and space Z are centered about a common vertical axis.

Sacrificial substructure removal system 500 may be configured to align the support structure 300 having sacrificial substructure 10 and barrier 30 with the puncture plate 520 and puncture pins 530 on support frame 510, as illustrated in FIG. 7. For example, in response to a control signal from a controller, the support structure 300 may be manipulated so that the portion of the sacrificial substructure 10 exposed through the opening of the support structure 300 is aligned with puncture plate 520 and puncture pins 530. In some embodiments, the controller causes the support structure 300 to move with respect to the sacrificial substructure removal system 500 generally to cause the proper alignment. In some embodiments, the controller causes a frame holder holding support structure 300 to move with respect to the sacrificial substructure removal system 500 generally to cause the proper alignment.

Figure 8:
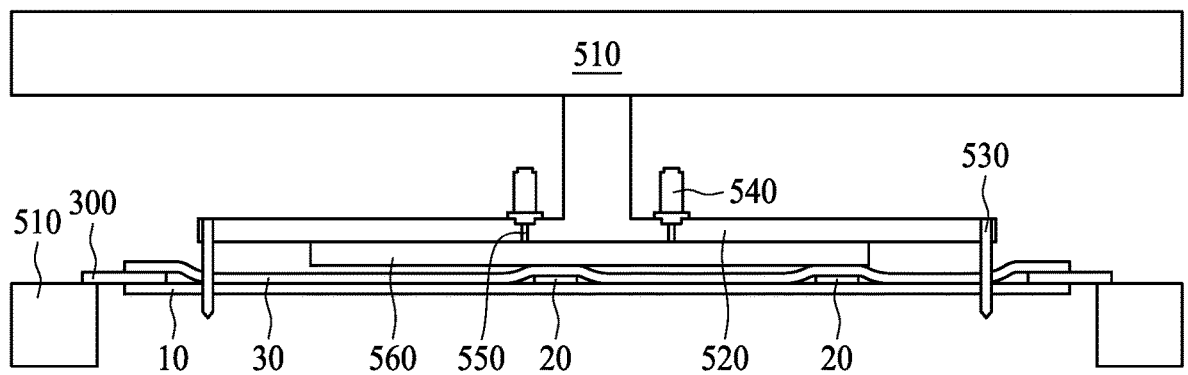

FIG. 8 illustrates a sacrificial substructure removal system 500 at 160 of the method 100 of FIG. 1. Accordingly, the sacrificial substructure removal system 500 is configured to cause the puncture plate 520 to secure the sacrificial substructure and the barrier connected thereto at least by using puncture pins 530. For example, in response to a control signal from the controller, sacrificial substructure removal system 500 may be configured to move the puncture plate 520 and puncture pins 530 with respect to the support structure 300 so as to cause the puncture pins 530 to puncture or pierced through barrier 30 and sacrificial substructure 10. As a result of puncture pins 530 puncturing or piercing through barrier 30 and sacrificial sub structure 10, sacrificial substructure 10 and barrier 30 are secured to puncture plate 520. As a result of the puncture plate 520 and puncture pins 530 securing barrier 30 and sacrificial substructure 10, additional movement of the puncture plate 520 causes movement of the sacrificial substructure 10 and the barrier 30. For example, additional movement of the puncture plate 520 may cause the sacrificial substructure 10 and the barrier 30 to move with the puncture plate 520.

Figure 9:
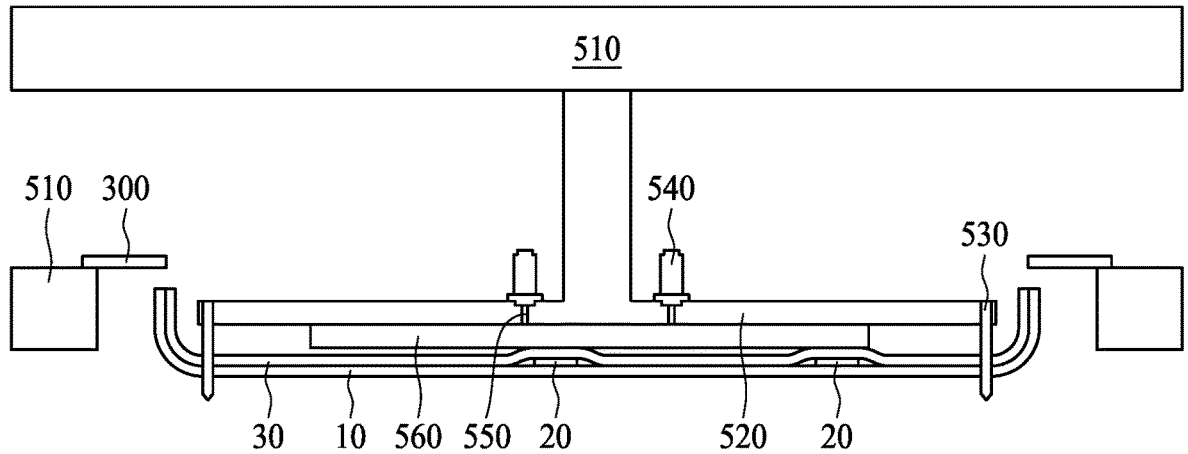

FIG. 9 illustrates a sacrificial substructure removal system 500 at 170 of the method 100 of FIG. 1. Accordingly, the sacrificial substructure removal system 500 is configured to cause the puncture plate 520 and puncture pins 530 to remove the sacrificial substructure 10 and the barrier 30 connected thereto from the support structure 300. For example, in response to a control signal from the controller, sacrificial substructure removal system 500 may be configured to move puncture plate 520 and puncture pins 530 with respect to the support structure 300 so as to cause the puncture plate 520 and puncture pins 530 to move through the opening in the support structure 300. As a result of the puncture plate 520 and puncture pins 530 moving through the opening in the support structure 300, the puncture plate 520 and puncture pins 530, having the barrier 30 and sacrificial substructure 10 secured thereto, applies a force through the barrier 30 to the sacrificial substructure 10, where the force causes the sacrificial substructure 10 to detach from the support structure 300.

At least because the puncture pins 530 cause the sacrificial substructure 10 and the barrier 30 to be securely attached to puncture plate 520, the movement of the puncture plate 520 through the opening in the support structure 300 results in reliable detachment of the sacrificial substructure 10 and the barrier 30 from the support structure 300. Because the puncture pins 530 extend through the sacrificial substructure 10 and the barrier 30, when the puncture plate 520 extends through the opening in the support structure 300, the puncture pins 530 exert a tension force on the sacrificial substructure 10 and the barrier 30, and the tension forces the failure of the adhesion causing sacrificial substructure 10 to be connected to support structure 300. Without secure attachment of the sacrificial substructure 10 and the barrier 30 to the puncture plate 520 by the puncture pins 530, if a plate without puncture pins 530 were to extend through the opening in the support structure 300, the plate would cause sacrificial substructure 10 to only partially detach from support structure 300.

Figure 10:
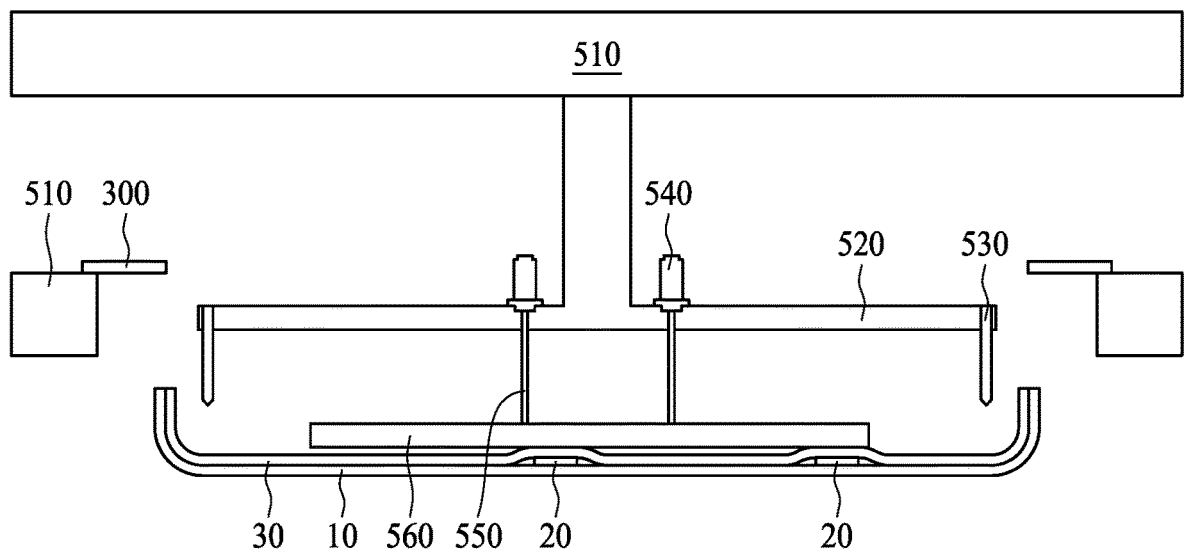

FIG. 10 illustrates a sacrificial substructure removal system 500 at 180 of the method 100 of FIG. 1. Accordingly, the sacrificial substructure removal system 500 is configured to cause the sacrificial substructure 10 and the barrier 30 to be removed from the puncture plate 520 and the puncture pins 530. For example, in response to a control signal from the controller, sacrificial substructure removal system 500 may be configured to cause, for example, cylinders or motors of waste plate actuators 540 to extend waste plate actuation pins 550 so that waste plate 560 moves with respect to the sacrificial substructure 10 and the barrier 30. As a result of the movement of the waste plate 560 the sacrificial substructure 10 and the barrier 30 are caused to detach from the puncture pins 530 and puncture plate 520.

Once detached, the sacrificial substructure 10 and the barrier 30 may be processed, for example as waste, and/or maybe recycled.

Figure 11:
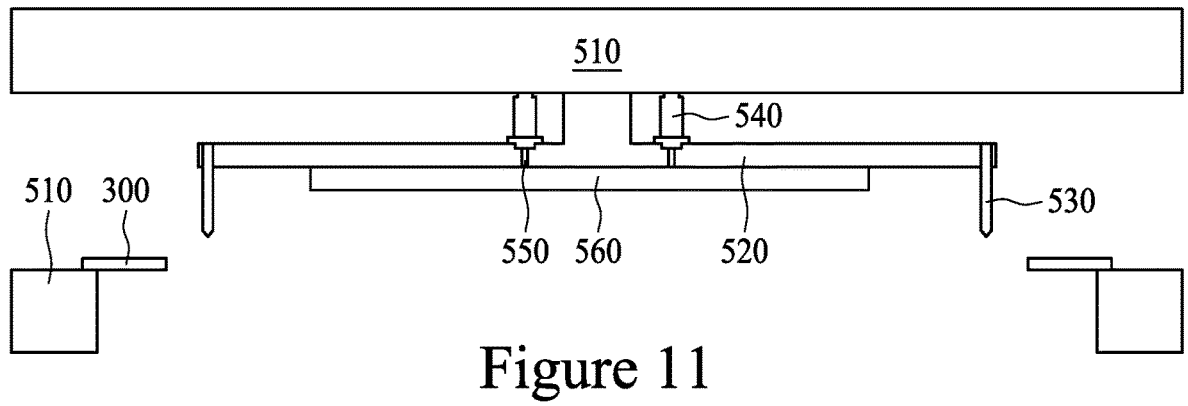

FIG. 11 illustrates a sacrificial substructure removal system 500 at 190 of the method 100 of FIG. 1. Accordingly, the sacrificial substructure removal system 500 is configured to move or retract waste plate 560. For example, in response to a control signal from the controller, sacrificial substructure removal system 500 may be configured to cause waste plate actuators 542 to retract waste plate actuation pins 550 so that waste plate 560 moves with respect to support structure 300 and/or support frame 510. As a result of the movement of the waste plate 560, the sacrificial substructure removal system 500 is prepared to process another support structure having a sacrificial substructure and barrier connected thereto.

Figure 12:
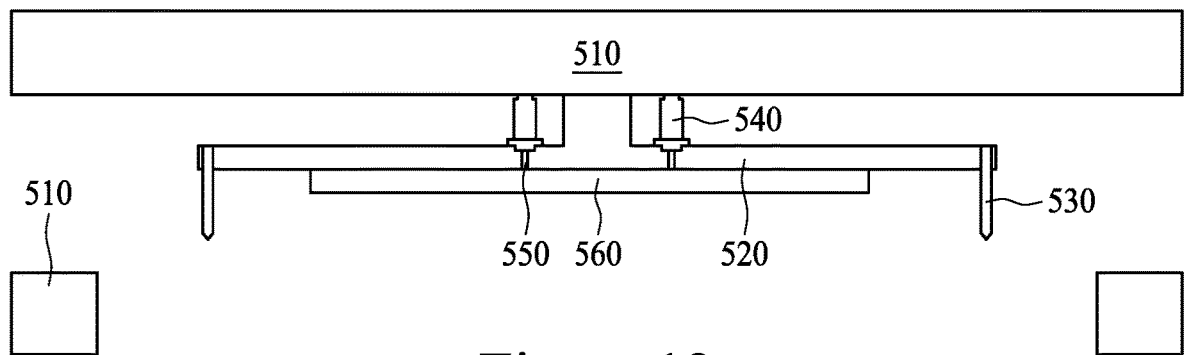

FIG. 12 illustrates a sacrificial substructure removal system 500 at 195 of the method 100 of FIG. 1. Accordingly, sacrificial substructure removal system 500 is configured to remove or have removed the support structure 300. For example, in response to a control signal from the controller, a frame holder holding support structure 300 moves with respect to the sacrificial substructure removal system 500 generally to cause the support structure 300 to be removed from sacrificial substructure removal system 500. In some embodiments, in response to a control signal from the controller, support frame 510 moves with respect to the sacrificial substructure removal system 500 generally to cause the support structure 300 to be removed. In some embodiments, support frame 510 is or comprises or is part of a frame holder.

As discussed in further detail above, at least because the puncture pins 530 cause the sacrificial substructure 10 and the barrier 30 to be securely attached to puncture plate 520, the movement of the puncture plate 520 through the opening in the support structure 300 results in reliable detachment of the sacrificial substructure 10 and the barrier 30 from the support structure 300. Because the puncture pins 530 extend through the sacrificial substructure 10 and the barrier 30, when the puncture plate 520 extends through the opening in the support structure 300, the puncture pins 530 exert a tension force on the sacrificial substructure 10 and the barrier 30, and the tension forces the failure of the adhesion causing sacrificial substructure 10 to be connected to support structure 300.

An inventive aspect is a method of removing a sacrificial substructure from a support structure. The method includes receiving the support structure, where the support structure has the sacrificial substructure connected thereto, the sacrificial substructure having functioning electrical devices removed therefrom. The method also includes applying a barrier to the sacrificial substructure, puncturing the sacrificial substructure with a puncture plate to secure the sacrificial substructure to the puncture plate, and detaching the sacrificial substructure from the support structure by moving the puncture plate with respect to the support structure.

In some embodiments, the sacrificial substructure has nonfunctioning electrical devices adhered thereto.

In some embodiments, the barrier is non-adhesive.

In some embodiments, the sacrificial substructure includes an adhesive layer.

In some embodiments, receiving the support structure includes receiving the support structure having the sacrificial substructure adhered thereto by the adhesive layer.

In some embodiments, applying the barrier to the sacrificial substructure includes adhering the barrier to the sacrificial substructure with the adhesive layer of the sacrificial substructure.

In some embodiments, securing the sacrificial substructure to the puncture plate includes piercing the sacrificial substructure with one or more puncture pins connected to the puncture plate.

In some embodiments, detaching the sacrificial substructure from the support structure includes applying a tension to the sacrificial substructure with the one or more puncture pins.

In some embodiments, the tension causes the sacrificial substructure to detach from the support structure.

Another inventive aspect is a sacrificial substructure detach tool. The sacrificial substructure detach tool includes a barrier applicator configured to receive a support structure, where the support structure has a sacrificial substructure connected thereto, and where the barrier applicator is configured to apply a barrier to the sacrificial substructure. The sacrificial substructure detach tool also includes a sacrificial substructure remover configured to secure the sacrificial substructure to a movable structure by puncturing the sacrificial substructure, and to detach the sacrificial substructure from the support structure by moving the movable structure.

In some embodiments, the sacrificial substructure has nonfunctioning electrical devices adhered thereto.

In some embodiments, the barrier is non-adhesive.

In some embodiments, the sacrificial substructure includes an adhesive layer.

In some embodiments, the barrier applicator is configured to receive the support structure having the sacrificial substructure adhered thereto by the adhesive layer.

In some embodiments, barrier applicator is configured to apply the barrier to the sacrificial substructure by adhering the barrier to the sacrificial substructure with the adhesive layer of the sacrificial substructure.

In some embodiments, the sacrificial substructure remover is configured to secure the sacrificial substructure to the movable structure by piercing the sacrificial substructure with one or more puncture pins connected to the sacrificial substructure remover.

In some embodiments, the sacrificial substructure remover is configured to apply a tension to the sacrificial substructure with the one or more puncture pins.

In some embodiments, the tension causes the sacrificial substructure to detach from the support structure.

Another inventive aspect is a semiconductor manufacturing tool configured to remove a sacrificial substructure from a support structure. The semiconductor manufacturing tool includes a movable puncture plate configured to puncture the sacrificial substructure and to detach the sacrificial substructure from the support structure by moving the movable puncture plate.

In some embodiments, the movable puncture plate includes one or more puncture pins configured to puncture the sacrificial substructure, where the one or more puncture pins are configured to apply a tension to the sacrificial substructure with the one or more puncture pins, and where the tension causes the sacrificial substructure to detach from the support structure.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of removing a sacrificial substructure from a support structure, the method comprising:
   receiving the support structure, wherein the support structure has the sacrificial substructure connected thereto, the sacrificial substructure having functioning electrical devices removed therefrom;
   applying a barrier to the sacrificial substructure;
   puncturing the sacrificial substructure with a puncture plate to secure the sacrificial substructure to the puncture plate; and
   detaching the sacrificial substructure from the support structure by moving the puncture plate with respect to the support structure.

2. The method of claim 1, wherein the sacrificial substructure has nonfunctioning electrical devices adhered thereto.

3. The method of claim 1, wherein the barrier is non-adhesive.

4. The method of claim 1, wherein the sacrificial substructure comprises an adhesive layer.

5. The method of claim 4, wherein receiving the support structure comprises receiving the support structure having the sacrificial substructure adhered thereto by the adhesive layer.

6. The method of claim 4, wherein applying the barrier to the sacrificial substructure comprises adhering the barrier to the sacrificial substructure with the adhesive layer of the sacrificial substructure.

7. The method of claim 1, wherein securing the sacrificial substructure to the puncture plate comprises piercing the sacrificial substructure with one or more puncture pins connected to the puncture plate.

8. The method of claim 7, wherein detaching the sacrificial substructure from the support structure comprises applying a tension to the sacrificial substructure with the one or more puncture pins.

9. The method of claim 8, wherein the tension causes the sacrificial substructure to detach from the support structure.

10. A method of removing a sacrificial substructure from a support structure, the method comprising:
    aligning a barrier with the support structure, wherein the support structure has the sacrificial substructure connected thereto, the sacrificial substructure having functioning electrical devices removed therefrom;
    applying the barrier to the sacrificial substructure;
    puncturing the sacrificial substructure with a puncture plate to secure the sacrificial substructure to the puncture plate; and
    detaching the sacrificial substructure from the support structure by moving the puncture plate with respect to the support structure.

11. The method of claim 10, wherein the sacrificial substructure has nonfunctioning electrical devices adhered thereto.

12. The method of claim 10, wherein the barrier is non-adhesive.

13. The method of claim 10, wherein the sacrificial substructure comprises an adhesive layer.

14. The method of claim 13, wherein receiving the support structure comprises receiving the support structure having the sacrificial substructure adhered thereto by the adhesive layer.

15. The method of claim 13, wherein applying the barrier to the sacrificial substructure comprises adhering the barrier to the sacrificial substructure with the adhesive layer of the sacrificial substructure.

16. The method of claim 10, wherein securing the sacrificial substructure to the puncture plate comprises piercing the sacrificial substructure with one or more puncture pins connected to the puncture plate.

17. The method of claim 16, wherein detaching the sacrificial substructure from the support structure comprises applying a tension to the sacrificial substructure with the one or more puncture pins.

18. The method of claim 17, wherein the tension causes the sacrificial substructure to detach from the support structure.

19. A method comprising:
    providing a support structure and a sacrificial substructure connected thereto, the sacrificial substructure having functioning electrical devices removed therefrom;
    applying a barrier to the sacrificial substructure;
    puncturing the sacrificial substructure with a puncture plate to secure the sacrificial substructure to the puncture plate; and
    detaching the sacrificial substructure from the support structure by moving the puncture plate with respect to the support structure.

20. The method of claim 19, wherein the sacrificial substructure has nonfunctioning electrical devices adhered thereto.

* * * * *